(12) United States Patent
Kanki

(10) Patent No.: US 9,196,526 B2
(45) Date of Patent: Nov. 24, 2015

(54) SEMICONDUCTOR DEVICE AND MANUFACTURING METHOD HAVING COPPER INTERCONNECTS WITH METAL FILM, BARRIER METAL, AND METAL CAPS

(71) Applicant: FUJITSU LIMITED, Kawasaki-shi, Kanagawa (JP)

(72) Inventor: Tsuyoshi Kanki, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/078,139

(22) Filed: Nov. 12, 2013

(65) Prior Publication Data

US 2014/0264875 A1 Sep. 18, 2014

(30) Foreign Application Priority Data

Mar. 18, 2013 (JP) ................................. 2013-055671

(51) Int. Cl.
*H01L 21/768* (2006.01)
*H01L 23/532* (2006.01)
*H01L 23/14* (2006.01)
*H01L 23/498* (2006.01)
*H01L 23/48* (2006.01)

(52) U.S. Cl.
CPC .... *H01L 21/76852* (2013.01); *H01L 21/76849* (2013.01); *H01L 23/147* (2013.01); *H01L 23/49822* (2013.01); *H01L 23/49827* (2013.01); *H01L 23/481* (2013.01); *H01L 23/53238* (2013.01); *H01L 2224/16225* (2013.01); *H01L 2924/15192* (2013.01); *H01L 2924/15311* (2013.01)

(58) Field of Classification Search
CPC ............................ H01L 21/768; H01L 23/532
USPC ........................................... 257/751; 438/653
See application file for complete search history.

(56) References Cited

U.S. PATENT DOCUMENTS

| 6,342,444 | B1 | 1/2002 | Higashi et al. | |
|---|---|---|---|---|
| 2005/0017361 | A1* | 1/2005 | Lin et al. | 257/756 |
| 2005/0245086 | A1 | 11/2005 | Wang et al. | |
| 2007/0007657 | A1* | 1/2007 | Hineman et al. | 257/758 |
| 2007/0020912 | A1* | 1/2007 | Nishiyama et al. | 438/613 |
| 2010/0176513 | A1* | 7/2010 | Agarwala et al. | 257/758 |
| 2011/0163451 | A1* | 7/2011 | Matsumoto et al. | 257/751 |
| 2011/0294291 | A1 | 12/2011 | Matsui et al. | |
| 2012/0267785 | A1* | 10/2012 | Oh et al. | 257/751 |

FOREIGN PATENT DOCUMENTS

| JP | 2000-260769 | 9/2000 |
|---|---|---|
| JP | 2003-179057 | 6/2003 |
| JP | 2007-073974 | 3/2007 |
| JP | 2012-009804 | 1/2012 |

* cited by examiner

*Primary Examiner* — Kevin Parendo
*Assistant Examiner* — Lamont Koo
(74) *Attorney, Agent, or Firm* — Fujitsu Patent Center

(57) ABSTRACT

A semiconductor device includes a copper interconnect provided in a trench in an insulation film, a metal film provided on the insulation film along a boundary between the insulation film and the copper interconnect, a barrier metal provided between an inner wall of the trench and the copper interconnect and extending over the metal layer, a first metal cap to cover the copper interconnect and the barrier metal located over the metal film, and a second metal cap to continuously cover the first metal cap, the barrier metal and the metal film.

9 Claims, 17 Drawing Sheets

FIG.7

|  | STRUCTURE OF FIG. 1A | STRUCTURE OF FIG. 1B | EMBODIMENT |
|---|---|---|---|
| RATE OF DEFFECT | 80%(16/20) | 60%(12/20) | 0%(0/20) |

FIG.8
(A)
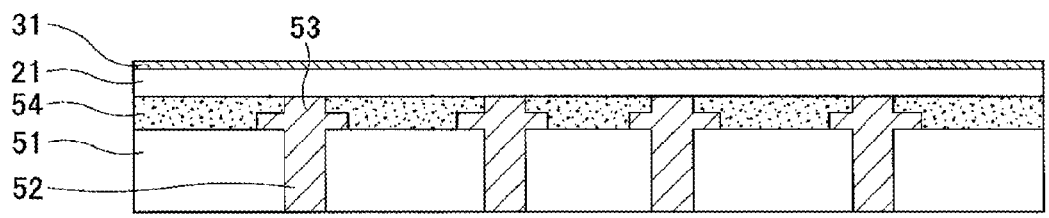
(B)
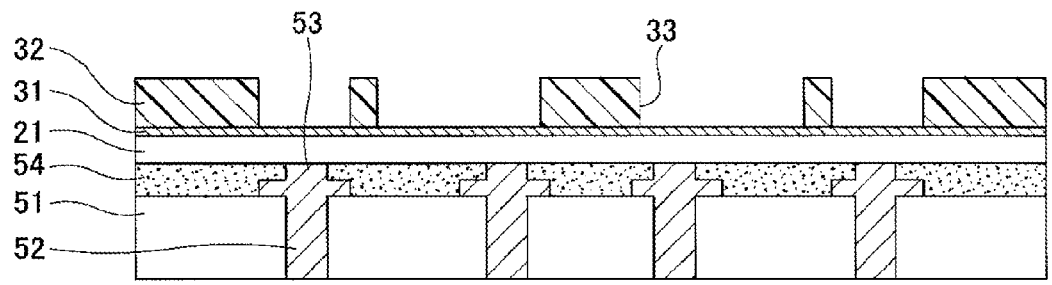
(C)
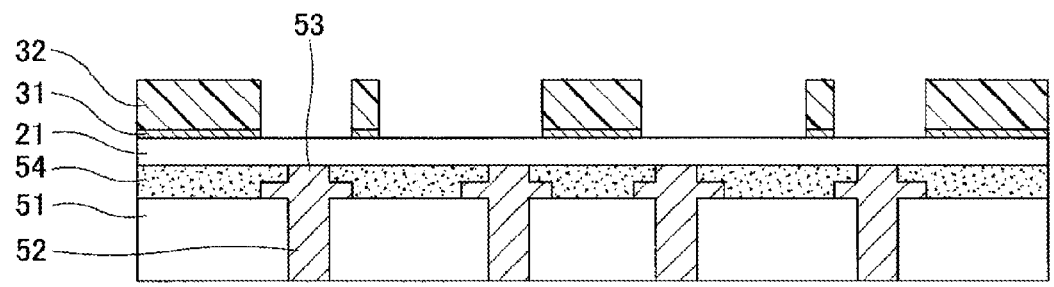

FIG.9
(A)
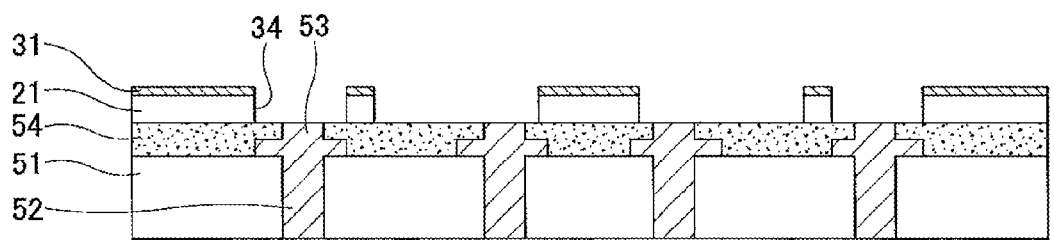
(B)
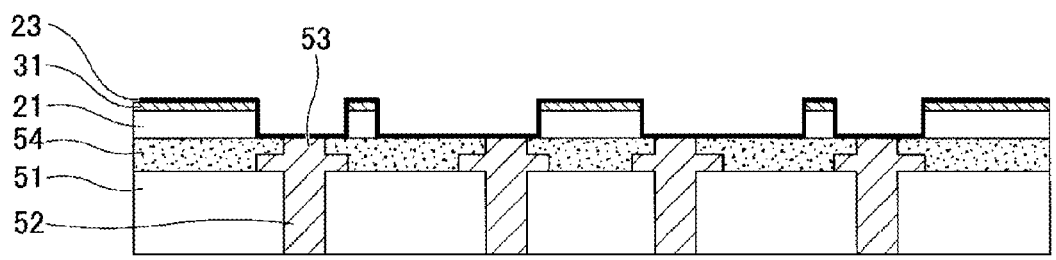
(C)
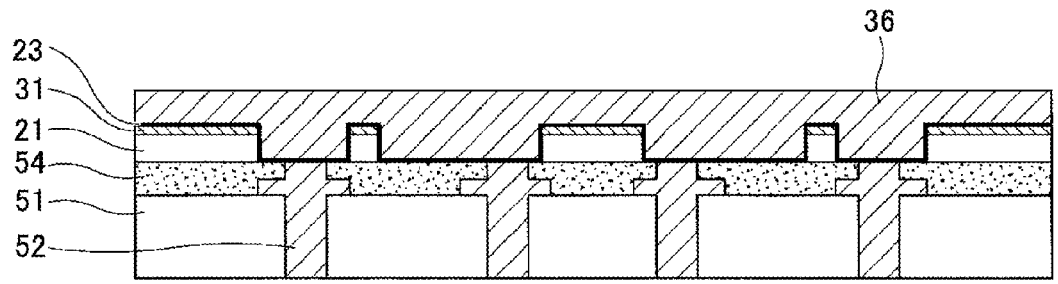

FIG.10
(A)
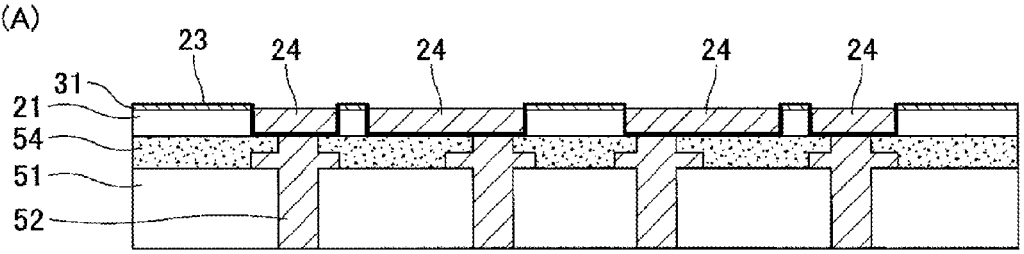
(B)
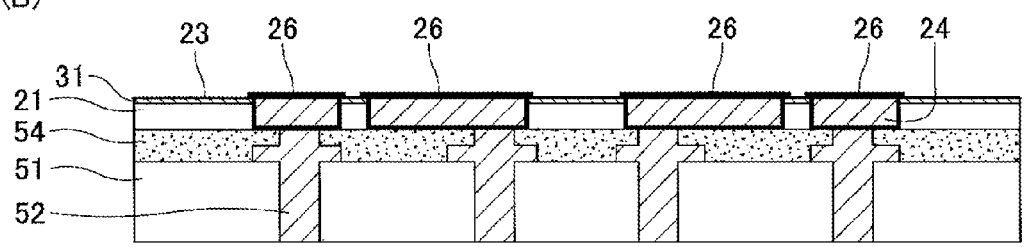
(C)
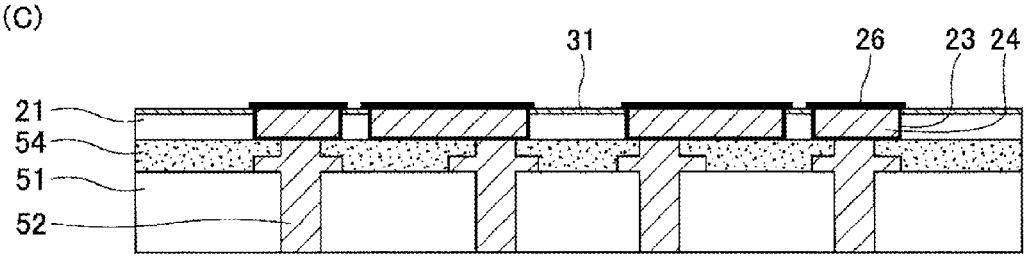

FIG.11
(A)
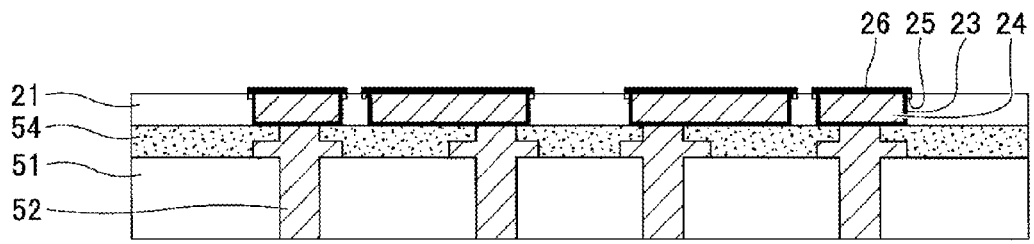
(B)
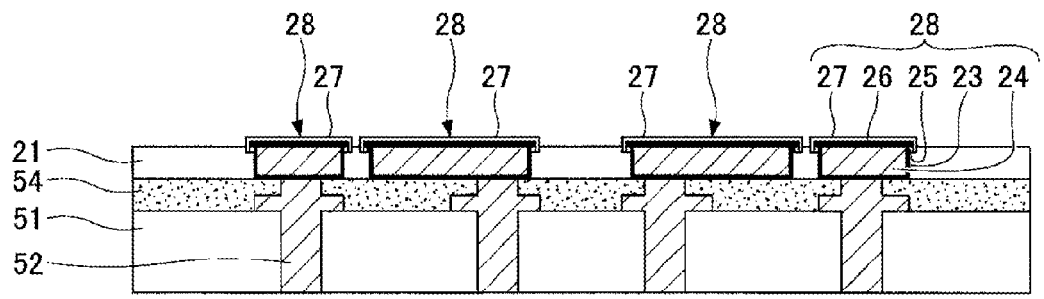
(C)
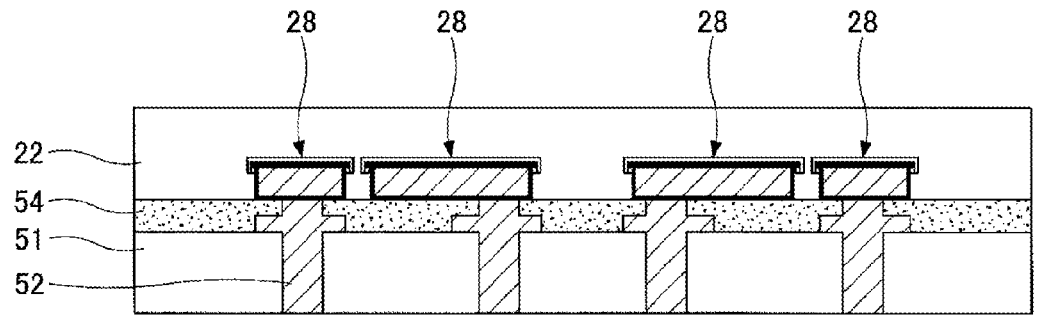

FIG.12
(A)
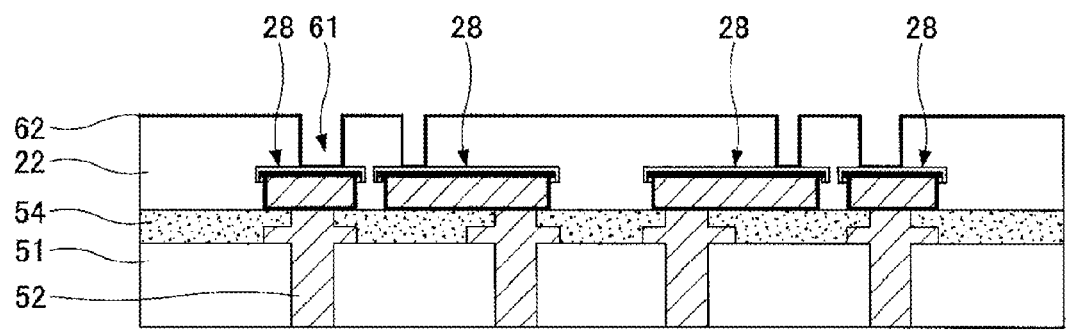
(B)
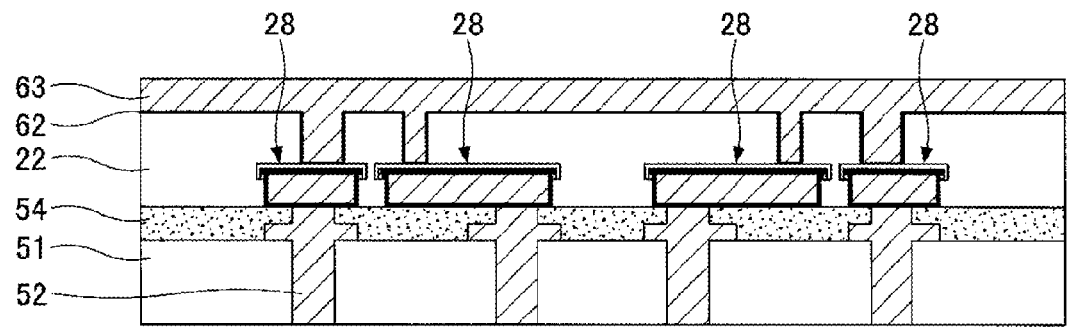
(C)
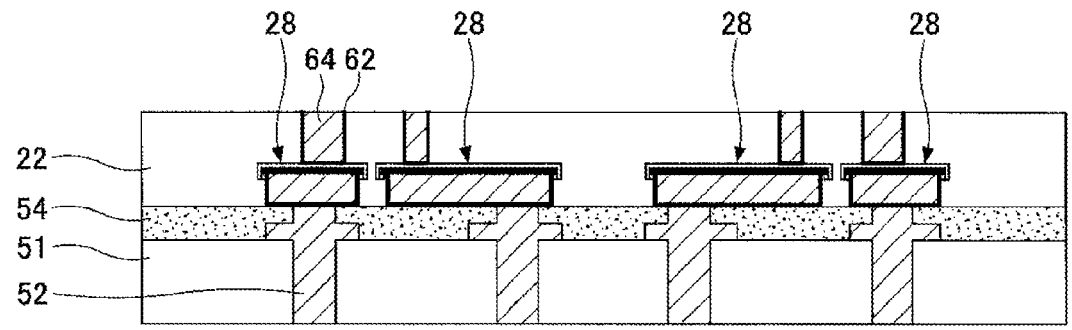

SEMICONDUCTOR DEVICE AND MANUFACTURING METHOD HAVING COPPER INTERCONNECTS WITH METAL FILM, BARRIER METAL, AND METAL CAPS

CROSS REFERENCE TO RELATED APPLICATIONS

This application claims benefit of priority of Japanese Patent Application No. 2013-055671 filed Mar. 18, 2013, which is incorporated herein by reference in its entirety.

FIELD

Present disclosures relate to a semiconductor device and a manufacturing method thereof.

BACKGROUND

With increasing demand for compact and high-performance electronic equipment in these years, the sizes of semiconductor chips and circuit boards are becoming smaller and smaller, and the number of terminals and the number of layers are increasing. Packaging densities of electronic components on a circuit board are also increasing. The increase in the number of terminals and reduction in a pitch between terminals cause another demand for miniaturization of rewiring interconnects used in circuit boards or packages. For this reason, micro-fabrication techniques for rewiring interconnects are attracting attention.

Many types of circuit boards, including a package substrate, wafer-level package (WLP) and silicon interposer, are known. In a structure in which multiple chips are connected via a silicon interposer to a package substrate, the line width of rewiring interconnects (i.e., chip-to-chip interconnects) in the silicon interposer is becoming smaller. As for a fabrication technique, a damascene process is replacing a conventional semi-additive process.

In general, rewiring interconnects for built-up (sub-composite) substrates used in a package substrate or rewiring interconnects in a wafer-level package are fabricated by a semi-additive process. However, it is difficult for a semi-additive process to control the etching line width and the adhesion strength of a copper (Cu) seed layer and a titanium (Ti) glue layer (or barrier metal layer).

Accordingly, a damascene process is preferred when fabricating fine interconnect patterns with the line width and the space width equal to or less than 5 µm.

FIG. 1A illustrates a damascene process, where a trench is formed in an insulation film 101 and a layer stack of a titanium film and a copper film (Cu/Ti stack) is formed in the trench by sputtering. Ti serves as a barrier metal 103 and Cu serves as a plating seed metal. The trench is filled with an electrolytic copper plating layer 104. Surplus copper is removed by chemical mechanical polishing (CMP). Then, the barrier metal 103 remaining on the surface of the substrate 101 is removed by CMP or wet etching to provide a damascene interconnect. (See, for example, Patent Documents 1 and 2 listed below).

A metal cap 106 is generally provided as a cap barrier layer over the surface of the damascene interconnect using cobalt (Co), nickel (Ni) or the like because the post-CMP surface of the interconnect is exposed without a barrier. Then, an insulation film 102 is formed over the substrate 101.

If the metal cap 106 is formed by electroless plating, the material of the metal cap 106 is not deposited over the barrier metal 103 formed of titanium or the like. For this reason, the boundary "A" between the Cu layer 104, the barrier metal 103, and the metal cap 106 is feeble. Due to diffusion of copper from the boundary, the reliability and durability of products are degraded.

PRIOR ART DOCUMENT

Patent Document 1: Japanese Laid-open Patent Publication No. 2000-260769
Patent Document 2: Japanese Laid-open Patent Publication No. 2007-73974
Patent Document 3: Japanese Laid-open Patent Publication No. 2012-9804

SUMMARY

In view of the above-described problem, the present disclosure provides a semiconductor device and a manufacturing method thereof which can prevent copper diffusion from an embedded interconnect.

In one aspect of the present disclosure, a semiconductor device includes
a copper interconnect provided in a trench in an insulation film,
a metal film provided on the insulation film along a boundary between the insulation film and the copper interconnect,
a barrier metal provided between an inner wall of the trench and the copper interconnect and extending over the metal film,
a first metal cap to cover the copper interconnect and the barrier metal located over the metal film, and
a second metal cap to continuously cover the first metal cap, the barrier metal and the metal film.

In another aspect of the present disclosure, a manufacturing method of a semiconductor device is provided. The method includes
forming a metal mask over an insulation film,
forming a trench in the insulation film using the metal mask,
forming a barrier metal over an inner wall of the trench and over the metal mask,
forming a copper interconnect in the trench via the barrier metal,
forming a first metal cap over the copper interconnect by electroless plating to allow the first metal cap to spread onto a part of the barrier metal,
removing a remaining part of the barrier metal and the metal mask, using the first metal cap as a mask, while maintaining said part of the barrier metal and a part of the metal film located under the first metal cap, and
forming a second metal cap over the first metal cap by electroless plating so as to continuously cover the first metal cap, said part of the barrier metal and said part of the metal mask.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 7 illustrates an advantage of the interconnect structure of the embodiment;

FIG. 8 illustrates a manufacturing process of a semiconductor device;

FIG. 9 illustrates a manufacturing process of the semiconductor device, following the process of FIG. 8;

FIG. 10 illustrates a manufacturing process of the semiconductor device, following the process of FIG. 9;

FIG. 11 illustrates a manufacturing process of the semiconductor device, following the process of FIG. 10;

FIG. 12 illustrates a manufacturing process of the semiconductor device, following the process of FIG. 11;

DESCRIPTION OF EMBODIMENTS

Figure 1A:
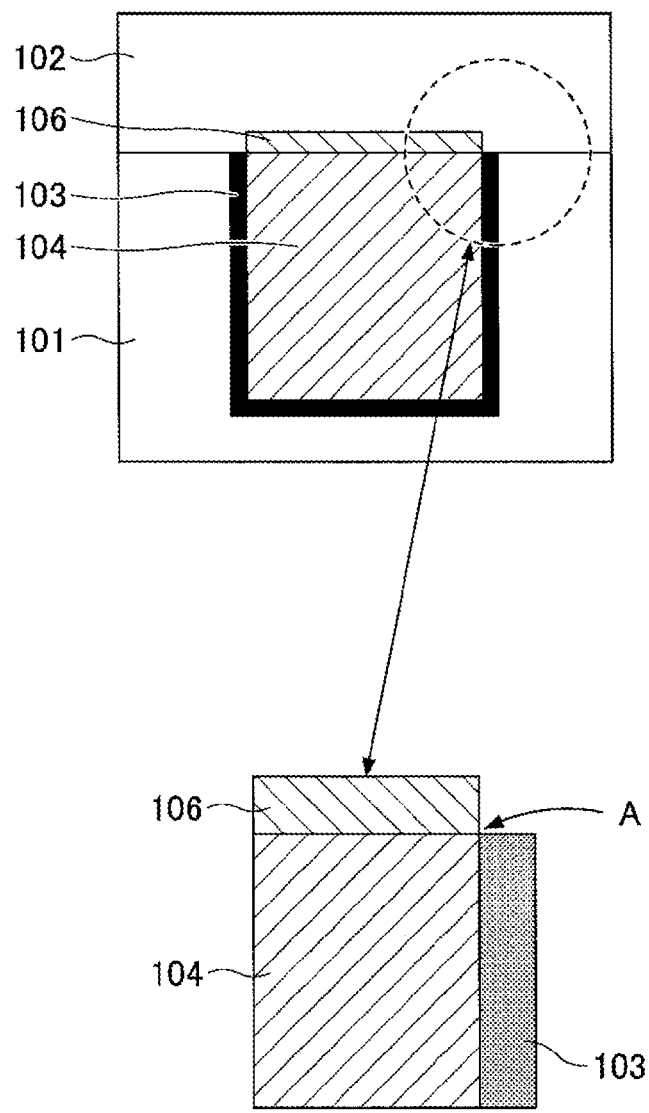
FIG. 1A is a schematic diagram to explain a problem occurring in a conventional damascene process.

As has been explained above, with the structure illustrated in FIG. 1A, copper (Cu) diffuses from the boundary "A" between the barrier metal 103, the Cu layer 104 and the metal cap 106. To overcome this problem, the structure illustrated in FIG. 1B may be conceived. In FIG. 1B, a part of the barrier metal 113 existing over the insulation film 101 is maintained and a metal cap 116 is formed over the Cu layer 104 such that the metal cap 116 spreads or overflows onto the barrier metal 113.

However, since the metal cap 116 formed by electroless plating does not grow over the barrier metal 113 made of titanium (Ti) or the like, the interface "B" between the metal cap 116 and the barrier metal 113 on the insulation film 101 is feeble. This structure is insufficient to prevent copper diffusion.

Figure 1B:
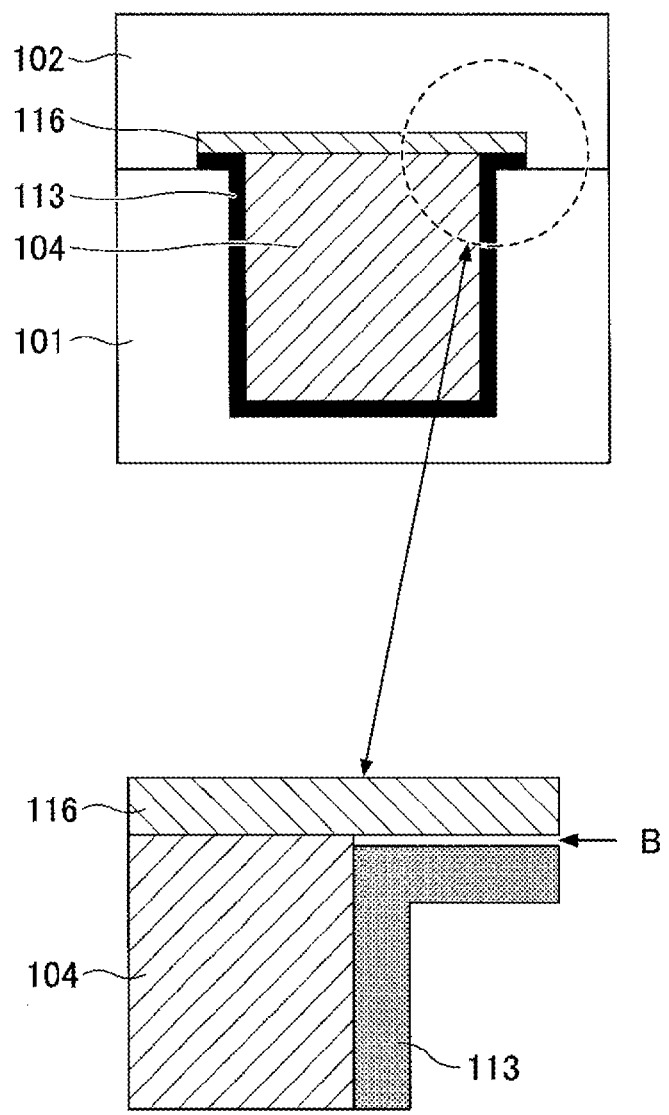
FIG. 1B illustrates a structure of a damascene interconnect conceived during a process leading to the present disclosure.
Figure 2:
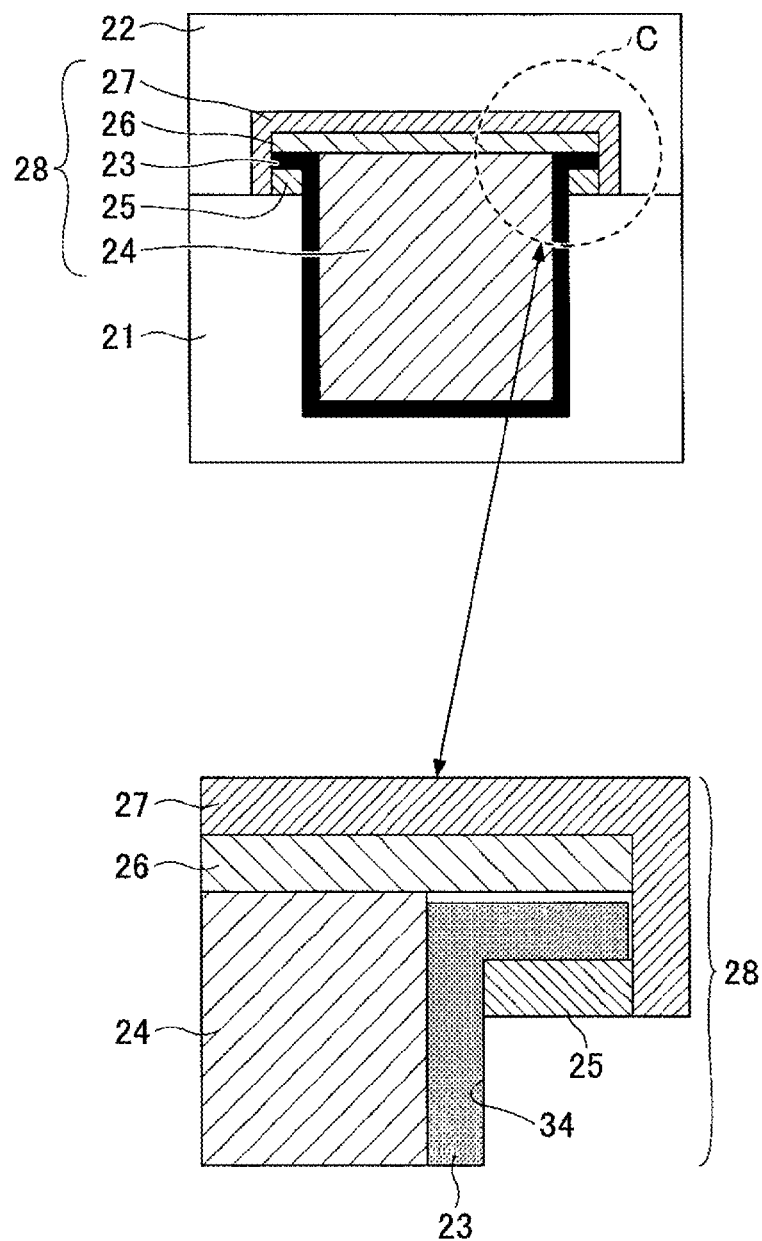
FIG. 2 illustrates a structure of an interconnect according to an embodiment.

FIG. 2 is a schematic diagram illustrating an interconnect structure 28 according to an embodiment. The interconnect structure 28 reinforces the interface "B" produced in the structure of FIG. 1B.

The interconnect structure 28 has a copper (Cu) interconnect layer 24 filling a trench 34 in an insulation film 21. A metal film 25 is provided over the insulation film 21 along the edge of the trench 34 in the boundary area "C". A barrier metal 23 provided between the inner wall of the trench 34 and the Cu interconnect layer 24 extends outward from the top end of the trench 34 to cover the top face of the metal film 25.

A first metal cap 26 is provided so as to cover the Cu interconnect layer 24 and the top face of the barrier metal 23. A second metal cap 27 is provided so as to continuously cover the first metal cap 26, the end face of the barrier metal 23 and the end face of the metal film 25.

The metal film 25 over the insulation film 21 is a residual of a metal mask which was used to form the trench 34 in the insulation film 21. The metal film 25, together with the second metal cap 27, reinforces the interface between the barrier metal 23 and the first metal cap 26. In this regard, the metal film 25 may be hereinafter referred to as an "assist metal 25".

In general, when forming the first metal cap 26 by electroless plating, the material of the first metal cap 26 grows over only the Cu interconnect layer 24, and it does not grow on the barrier metal 23. In the embodiment, the second metal cap 27 that continuously covers the first metal cap 26, the end face of the barrier metal 23 and the end face of the assist metal 25 is provided to reinforce the interface between the barrier metal 23 and the first metal cap 26.

The second metal cap 27 grows over the first metal cap 26 and the assist metal 25, although it does not grow over the barrier metal 23. By entirely covering the first metal cap 26 and the barrier metal 23 with the second metal cap 27 and the assist metal 25, copper diffusion from the Cu interconnect layer 24 can be prevented.

The material of the assist metal 25 is one that allows the second metal cap to grow and that can be used as a metal mask for forming the trench 34.

For example, cobalt (Co), nickel (Ni), chromium (Cr), iron (Fe), platinum (Pt), or gold (Au) may be used to form the assist metal 25.

The material of the barrier metal 23 is one that has a low resistance and that can enhance adhesion between copper and the insulation film 21. For example, titanium (Ti), tantalum (Ta), tungsten (W), titanium nitride (TiN), tantalum nitride (TaN), tungsten nitride (WN), and an alloy of these materials may be used to form the barrier metal 23. The material of the barrier metal 23 and the material of the assist metal 25 are different from each other.

The first metal cap 26 prevents copper from diffusion from the top face of the Cu interconnect layer 24 to an insulation film 22. The first metal cap 26 is formed of a low-resistance film with good adhesion to both the Cu interconnect layer 24 and the insulation film 22. For example, cobalt (Co), nickel (Ni), nickel-phosphorous (NiP) alloy, tungsten-phosphorous (WP) alloy, nickel-tungsten-phosphorous (NiWP), cobalt-tungsten-phosphorous (CoWP), etc., may be used to form the first metal cap 26.

The material of the second metal cap 27 may be the same as or different from that of the first metal cap 26. The material of the second metal cap 27 includes gold (Au), in addition to those used for the first metal cap 26.

With the structure of FIG. 2, copper diffusion from the Cu interconnect layer 24 formed by a damascene process is prevented, and device reliability and device durability are improved.

Figure 3:
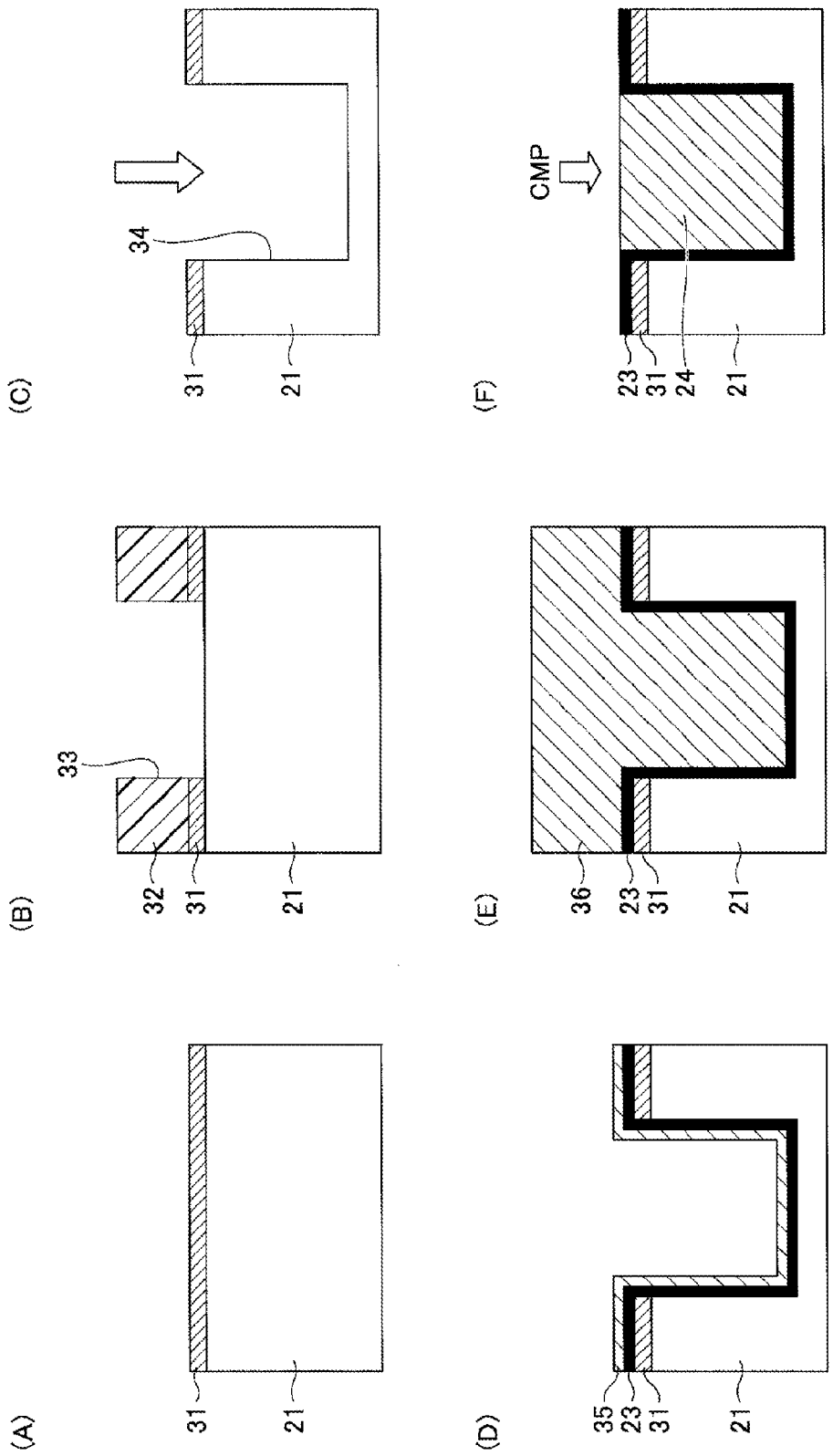
FIG. 3 illustrates a manufacturing process of an interconnect according to an embodiment.
Figure 4:
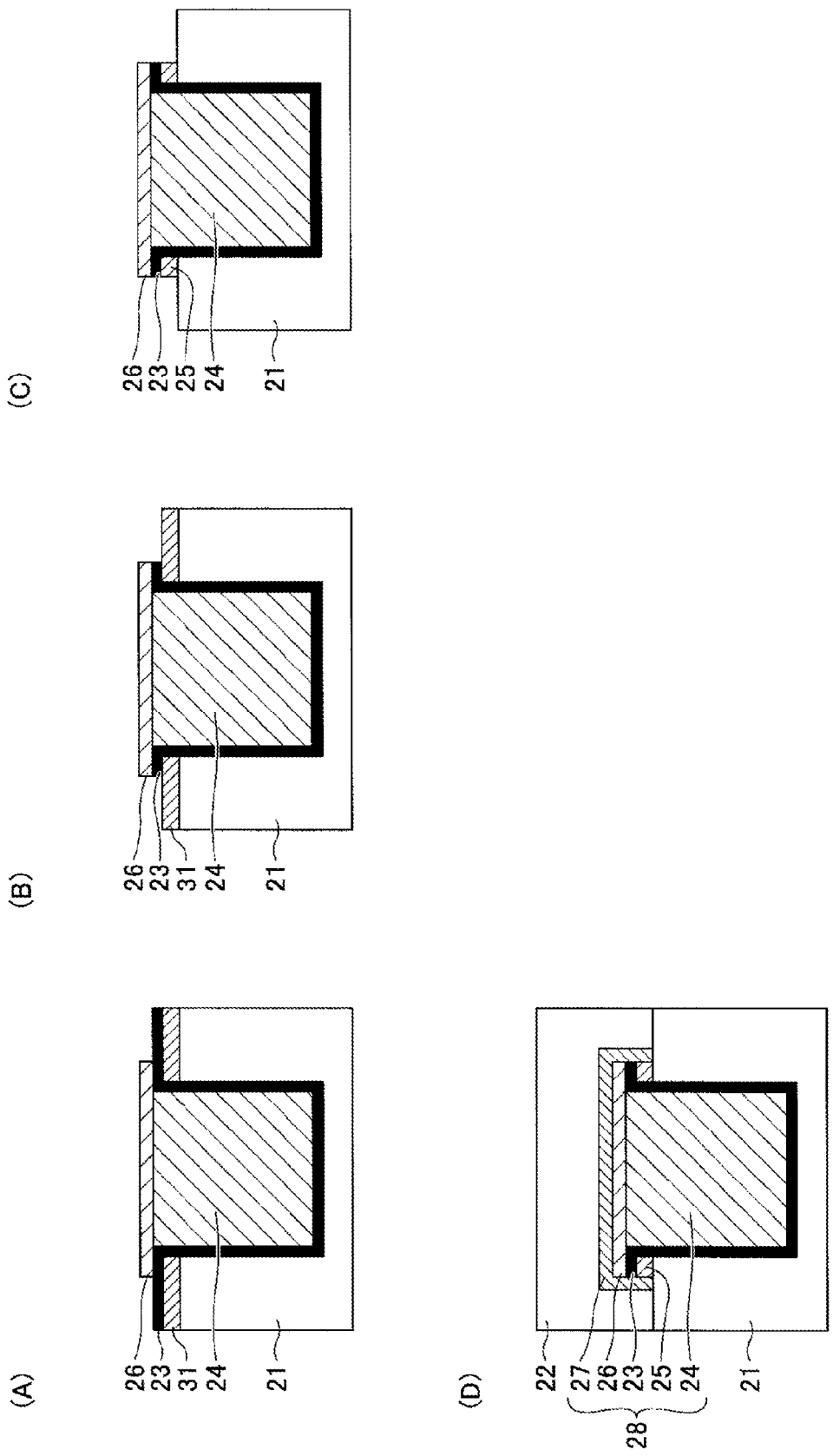
FIG. 4 illustrates a manufacturing process of the interconnect, following the process of FIG. 3, according to the embodiment.

FIG. 3 and FIG. 4 illustrate a manufacturing process of the interconnect structure 28 of FIG. 2.

First, in step (A) of FIG. 3, a metal film 31 is formed over the insulation film 21 to fabricate a metal mask. The thickness of the metal film 31 is 30 nm to 70 nm. In this example, a chromium film 31 with a thickness of 50 nm is formed.

In step (B) of FIG. 3, a photoresist 32 is applied onto the metal film 31 to a thickness of 2 μm, and it is processed into a pattern with a prescribed opening 33. The opening 33 corresponds to a trench with a line width of 1 μm. The metal film 31 is etched using the patterned photoresist 32 as a mask. The etching may be dry etching using one of or a mixture of etch gases of $CF_4$, $CHF_3$, $O_2$, or $Cl_2$. Alternatively, ion milling or wet etching may be employed. In the example of FIG. 3, a dry process is employed to etch the metal film 31.

In step (C) of FIG. 3, the photoresist 32 is removed after the etching of the metal film 31. An organic solvent such as acetone or N-Methylpyrrolidone (NMP) is used to remove the photoresist 32. Then, the insulation film 21 is etched using the patterned metal film 31 as a mask to form a trench 34 with a depth of 1 μm. The insulation film 21 may be etched using a single gas of $CF_4$ or $O_2$, or a mixture thereof.

In step (D) of FIG. 3, a barrier metal 23 with a thickness of 20 nm to 30 nm and a copper (Cu) seed layer 35 with a thickness of 80 nm to 150 nm are formed on the surface including the inner wall of the trench 34. The material of the barrier metal 23 is selected so as to be different from that of the metal film (metal mask) 31. In the example of FIG. 3, the Cu seed layer 35 with a thickness of 100 nm is formed over the Ti barrier metal 23 with a thickness of 30 nm.

In step (E) of FIG. 3, a Cu layer 36 is grown to a thickness of 3 μm using an acid copper sulfate plating solution to fill the trench 34.

In step (F) of FIG. 3, surplus Cu layer 36 is removed by chemical mechanical polishing (CMP) to expose the barrier metal 23. Thus, a Cu interconnect layer 24 is formed in the trench 34.

In step (A) of FIG. 4, a first metal cap 26 with a thickness of 50 nm to 150 nm is formed over the Cu interconnect layer 24 by electroless plating. The material of the first metal cap 26 includes Co—W—P, Co—P, Ni—P, Ni—W—P, etc. In this example, a nickel (Ni) film with a thickness of 150 nm is formed as the first metal cap 26. The first metal cap 26 grows so as to cover the top face of the Cu interconnect layer 24 and spread or overflow onto a part of the barrier metal 23.

In step (B) of FIG. 4, the barrier metal 23 is etched using the first metal cap 26 as an etching mask. The etching may be dry etching using CF4 single gas or a mixture gas of CF4 and O2, or wet etching using ammonium fluoride or the like. Through the etching, only the barrier metal 23 positioned directly under the first metal cap 26 is maintained.

In step (C) of FIG. 4, the metal film (metal mask) 31 is etched using the stack of the first metal cap 26 and the barrier metal 23 as an etching mask. In this example, the metal film 31 is a chromium film, and it is processed by wet etching using a di-ammonium cerium nitrate. Through the etching process, most of the metal film 31 is removed from the top face of the insulation film 21, except for that located along the contour of the trench 34 under the stack of the first metal cap 26 and the barrier metal 23. The remaining metal film 31 serves as an assist metal 25.

In step (D) of FIG. 4, a second metal cap 27 is formed of, for example, Co—W—P, Co—P, Ni—P, Ni—W—P, Au, Co, Ni, etc. The second metal cap 27 has a thickness of 40 nm to 100 nm and it covers entirely the stack of the first metal cap 26, the barrier metal 23 and the assist metal 25. Thus, the interconnect structure 28 is completed. Then, an insulation film 22 is deposited over the entire surface.

With this structure, the interface between the first metal cap 26 and the barrier metal 23 is sandwiched between the second metal cap 27 and the assist metal 25 in the boundary area C between the copper interconnect layer 24 and the insulation film 21. Accordingly, copper diffusion from the copper interconnect layer 24 into the insulation film 21 or insulation film 22 is sufficiently prevented.

Figure 5:
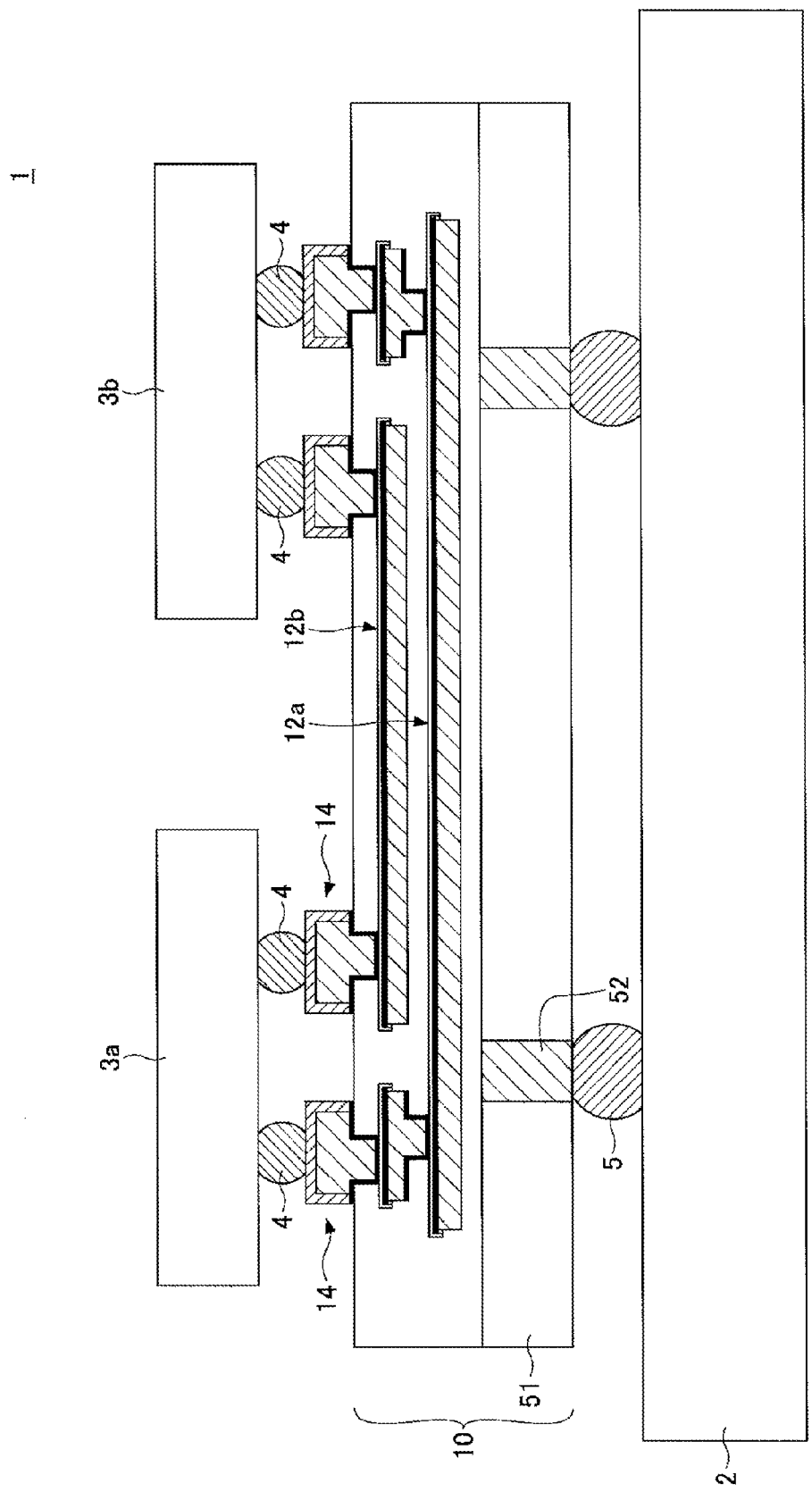
FIG. 5 is a schematic diagram of a semiconductor device to which the structure and the method of the embodiment is applied.

FIG. 5 is a schematic diagram of a semiconductor device 1 to which the interconnect structure 28 of FIG. 2 is applied. The semiconductor device 1 includes a package substrate 2, a relay board 10 such as an interposer board, and multiple semiconductor chips 3a and 3b. The relay board 10 is electrically connected to the package substrate 2 via external terminals 5. The semiconductor chips 3a and 3b are connected to electrode pads 14 via external electrodes 4 such as micro-bumps.

The interconnect structure 28 illustrated in FIG. 2 can be applied to re-wiring interconnects 12a and 12b. The re-wiring interconnects 12a and 12b are used to connect the semiconductor chip 3a and the semiconductor chip 3b. The interconnect structure 28 can also be applied to through-hole plugs 52 formed in a silicon substrate 51. Employing the structure of FIG. 2 and the process illustrated in FIG. 3 and FIG. 4, copper diffusion can be prevented and the reliability and the durability of products can be maintained even if the rewiring interconnects 12a and 12b are fabricated at high density by a damascene process.

The structure and the method of the embodiment can be applied to fabrication of global interconnects (not illustrated) to connect circuit blocks in the semiconductor chips 3a and 3b. In this case, the interconnect reliability is improved, and low-resistance and high-speed global interconnects can be realized. The structure and the method of the embodiments can also be applied to wiring interconnects of the respective layers of multi-layer interconnects formed on the silicon substrate 51 of the relay board 10.

Figure 6A:
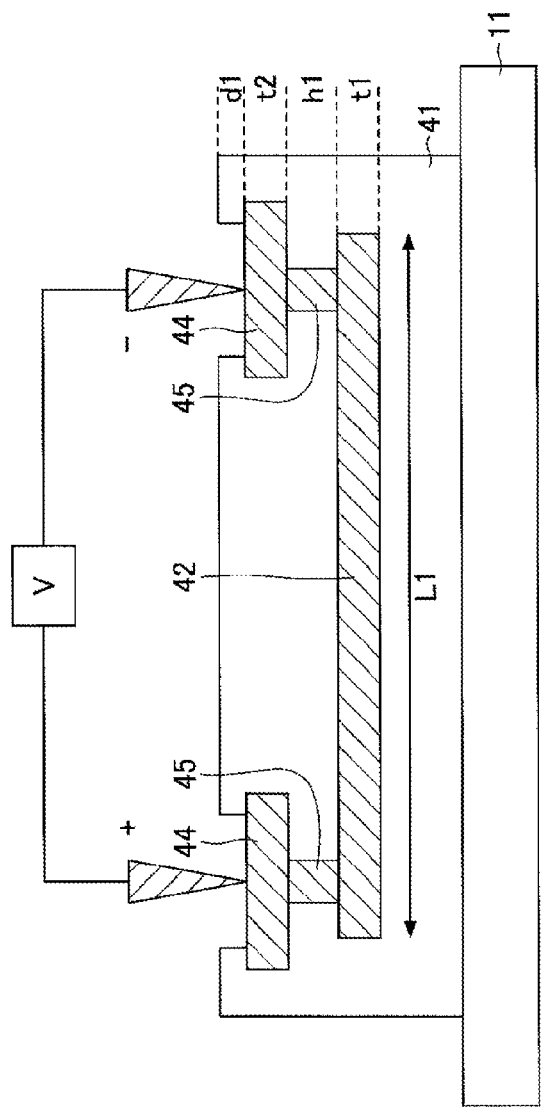
FIG. 6A illustrates a measurement model for evaluation of reliability of the interconnect.
Figure 6B:
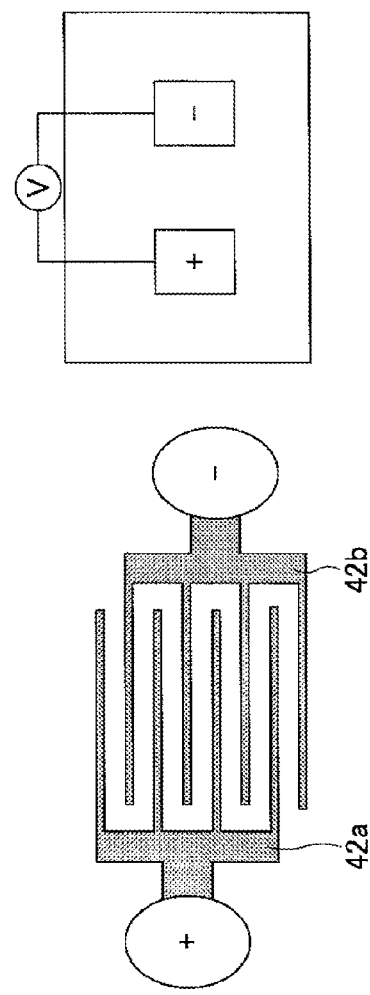
FIG. 6B illustrates an interconnect pattern used in the evaluation.

FIG. 6A illustrates a measurement model to carry out a reliability evaluation test on the interconnect structure 28 of the embodiment. To fabricate a sample, a copper interconnect 42 is formed in an insulation film 41 according to the process illustrated in FIG. 3 and FIG. 4. Then, via-contact plugs 45 and electrode pads 44 are fabricated for evaluation of electric characteristics. The copper interconnect 42 is comprised of a pair of interleaving comb patterns 42a and 42b as illustrated in FIG. 6B.

For the purpose of comparison, a sample with the interconnect structure of FIG. 1A ("comparison sample 1") and a sample with the interconnect structure of FIG. 1B ("comparison sample 2") are also fabricated. Twenty samples for each type of interconnect are fabricated. In all samples, the thickness t1 of the copper interconnect 42 is 1 μm, the length L1 f the copper interconnect 42 is 1000 μm, the height h1 of the via-contact plug 45 is 5 μm, the thickness t2 of the electrode pad 44 is 5 μm, and the thickness d1 from the top face of the electrode pad 44 to the top surface of the insulation film 41 is 5 μm. The diameter of the via-contact plug 45 is 1 μm, and the diameter of the electrode pad 44 is 90 μm.

In the sample of the embodiment, the top face of the copper interconnect 42 is covered with the first metal cap 26 and the second metal cap 27 (see FIG. 2), except for the junction area between the via-contact plug 45, and the assist metal 25 is formed in the insulation film 41 along the contour of the upper-most part of the copper interconnect 42. In contrast, in the comparison sample 1 with the structure of FIG. 1A, only the top face of the copper interconnect 104 is covered with a metal cap 106, and a gap is produced between the metal cap 106 and the barrier metal 103. In the comparison sample 2 with the structure of FIG. 1B, the top face of the copper interconnect 104 is covered with the extended metal cap 116, but the interface between the metal cap 116 and the barrier metal 113 is not adequately secure.

For evaluation, highly accelerated stress test (HAST) is performed on the three types of samples, and the samples with a leakage current exceeding $1.0*10^{-6}$ A are regarded as defective. The defect rate of twenty samples after 150 hours from the start of the test is calculated for each type of the samples. The comparison result is illustrated in FIG. 7.

In FIG. 7, the defect rate of the comparison sample 1 with the structure of FIG. 1A is 80%, and the defect rate of the comparison sample 2 with the structure of FIG. 1B is 60%. In contrast, the defect rate of the sample of the embodiment is zero percent. The samples fabricated by the process of the embodiment have a longer duration of time to malfunction, and the product reliability is improved.

FIG. 8 through FIG. 17 illustrate a manufacturing process of the semiconductor device 1. In step (A) of FIG. 8, a contact via plug with a diameter of 200 μm and a depth of 500 μm are formed in a silicon substrate 51. Then, the back face of the silicon substrate 51 is polished by chemical mechanical polishing (CMP) to form a through-hole plug 52. An interconnect 53 is formed over the through-hole plug 52 by electrolytic plating. Then, a resin film 54 is formed over the entire surface. The resin film 54 is polished by CMP using slurry with aluminum oxide abrasive grains until the top face of the interconnect 53 is exposed. The thickness of the resin film after the polishing is about 10 μm. An insulation film 21 is formed over the resin film 54. The insulation film 21 is formed of, for example, 1-μm-thickness of a permanent resist photosensitive resin.

A metal film 31 is formed over the insulation film 21 to fabricate a metal mask. The metal film 21 may be a chromium (Cr) film with a thickness of 50 nm formed by sputtering.

In step (B) of FIG. 8, a photoresist with a thickness of 3 μm is applied onto the metal film 31, and a resist mask 32 with apertures 33 is created by pattern-transfer exposure and development.

In step (C) of FIG. 8, the metal film 31 is processed by dry etching using the resist mask 32. The processed metal film 31 is used as the metal mask 31.

In step (A) of FIG. 9, the resist mask 32 is removed, and a trench 34 is formed in the insulation film 21 using the metal mask 31. The trench 34 is formed by dry etching using an appropriate etching gas such as $CF_4$, $Cl_2$, $O_2$ or the like. In this process, the top face of the interconnect 53 is exposed at the bottom of the trench 34.

In step (B) of FIG. 9, a titanium (Ti) film 23 with a thickness of 20 nm is formed over the entire surface by sputtering. The titanium film 23 serves as a barrier metal 23. The barrier metal 23 is formed over the inner wall of the trench 34 and the metal mask 31.

In step (C) of FIG. 9, a copper (Cu) seed layer (not illustrated) of a thickness of 100 nm is formed over the titanium film 23, and then a copper plating film 36 is grown to the thickness of 3 μm by electrolytic plating.

In step (A) of FIG. 10, a surplus portion (for example, 2-μm-thickness) of the copper plating film 36 is removed by CMP until the barrier metal 23 is exposed in the wafer surface. In this CMP process, a copper interconnect layer 24 is formed in the trench 34. The copper polish is, for example, slurry containing hydrogen peroxide (H2O2) or ammonium persulfate as an oxidizing agent.

In step (B) of FIG. 10, a first metal cap 26 is formed over the copper interconnect layer 24 by electroless plating. The first metal cap 26 spreads or overflows onto the barrier metal 23 from the surface of the copper interconnect layer 24 so as to cover a part of the barrier metal 23. The thickness of the first metal cap 26 is, for example, 50 nm, and it is formed of a Co—W—P alloy, a Co—P alloy, a Ni—P alloy, a Ni—W—P alloy, or the like.

In step (C) of FIG. 10, an exposed portion of the barrier metal 23 is removed by etching, using the first metal cap 26 as an etching mask. If the barrier metal 23 is formed of titanium (Ti), wet etching using ammonium fluoride or dry etching using $CF_4$ gas or mixture gas of $CF_4$ and $O_2$ may be employed. By the etching, the metal mask 31 over the insulation film 21 is exposed.

In step (A) of FIG. 11, the exposed metal mask 31 is removed by etching, using the first metal cap 26 as an etching mask. If the metal mask 31 is formed of chromium (Cr), wet etching using di-ammonium cerium nitrate or dry etching using $Cl_2$ gas, $CF_4$ gas, $O_2$ gas, or a mixture of $CF_4$ gas and $O_2$ gas may be employed. As a result of the etching, the metal mask 31 located under the first metal cap 26 is left as the assist metal 25.

In step (B) of FIG. 11, a second metal cap 27 is formed of a electoless plating material. The material of the second metal cap 27 may be the same as or different from that of the material of the first metal cap 26. For example, electroless plating solution of Co—W—P, Co—P, Ni—P, Ni—W—P, or Au may be used to form the second metal cap 27 to a thickness of 50 nm. The second metal cap 27 grows so as to cover the top face and the side faces of the first metal cap 26 and spread or deposit onto the end face of the barrier metal 23 and the end face of the assist metal 25, thereby continuously covering the entirety of the exposed surfaces of the first metal cap 26, the barrier metal 23 and the assist metal 25. Thus, the interconnect structure 28 is fabricated.

In step (C) of FIG. 11, an insulation film 22 is formed over the entire surface by applying, for example, a permanent resist photosensitive resin to a thickness of 5 μm.

In step (A) of FIG. 12, the insulation film 22 is patterned by exposure and development to form a via-hole 61 reaching the interconnect structure 28. Then, a layer stack 62 of copper over titanium (Cu(100 nm)/Ti(30 nm) film 62) is formed over the entire surface by sputtering.

In step (B) of FIG. 12, a copper (Cu) film 63 is formed by electrolytic plating to a thickness of 10 μm.

In step (C) of FIG. 12, the copper film 63 is flattened by CMP until the insulation film 22 is exposed to form a via plug 64. The copper film 63 is polished using slurry containing hydrogen peroxide (H2O2) or ammonium persulfate as an oxidizing agent. Then, the Ti film is removed by polishing using slurry containing H2O2 and silica abrasive grains.

Figure 13:
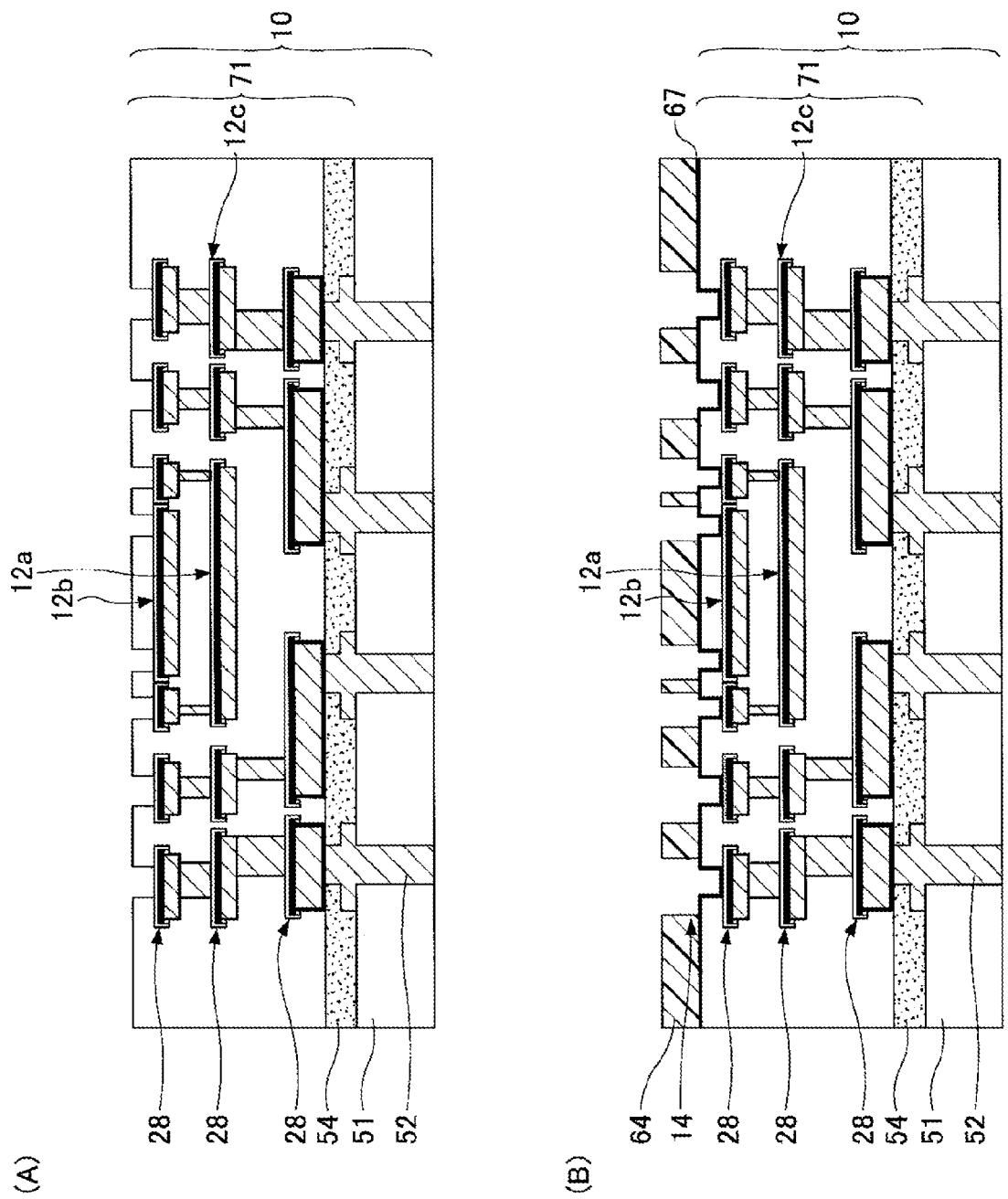
FIG. 13 illustrates a manufacturing process of the semiconductor device, following the process of FIG. 12.

In step (A) of FIG. 13, the step (A) of FIG. 8 through the step (C) of FIG. 12 are repeated to fabricate a multilevel interconnection 71. The multilevel interconnection 71 includes the rewiring interconnects 12a and 12b for connecting between semiconductor chips 3a and 3b, and a rewiring interconnect 12c for connecting the through-hole via 52 in the subsequent process. The rewiring interconnects 12a, 12b and 12c have the interconnect structures 28.

In step (B) of FIG. 13, a layer stack 67 of copper over titanium (Cu/Ti film 67) is formed over the entire surface, and then photoresist coating is applied to a thickness of 10 μm. Patterning and exposure are carried out on the photoresist coating to form a resist mask 64.

Figure 14:
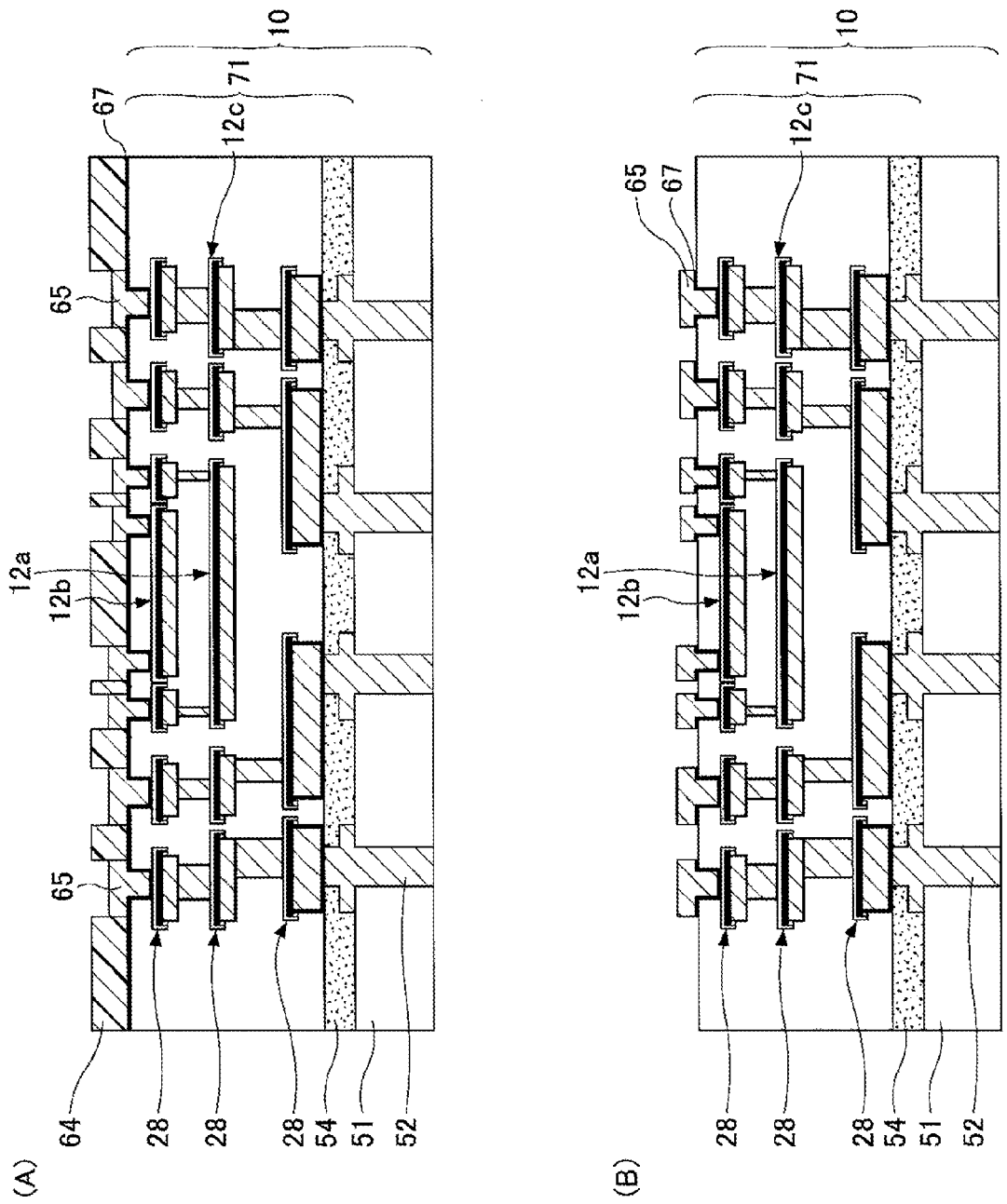
FIG. 14 illustrates a manufacturing process of the semiconductor device, following the process of FIG. 13.

In step (A) of FIG. 14, a copper (Cu) film 65 is formed by electrolytic plating to a thickness of 5 μm. The copper film 65 is used as an electrode layer 65.

In step (B) of FIG. 14, the resist mask 64 is removed and the surplus Cu/Ti film 67 left over the insulation film 22 is removed. The copper of the Cu/Ti film 67 may be etched using potassium sulphate, ammonium persulfate, or the like. The titanium of the Cu/Ti film 67 may be removed by wet etching using ammonium fluoride or dry etching using a mixture gas of $CF_4$ and $O_2$.

Figure 15:
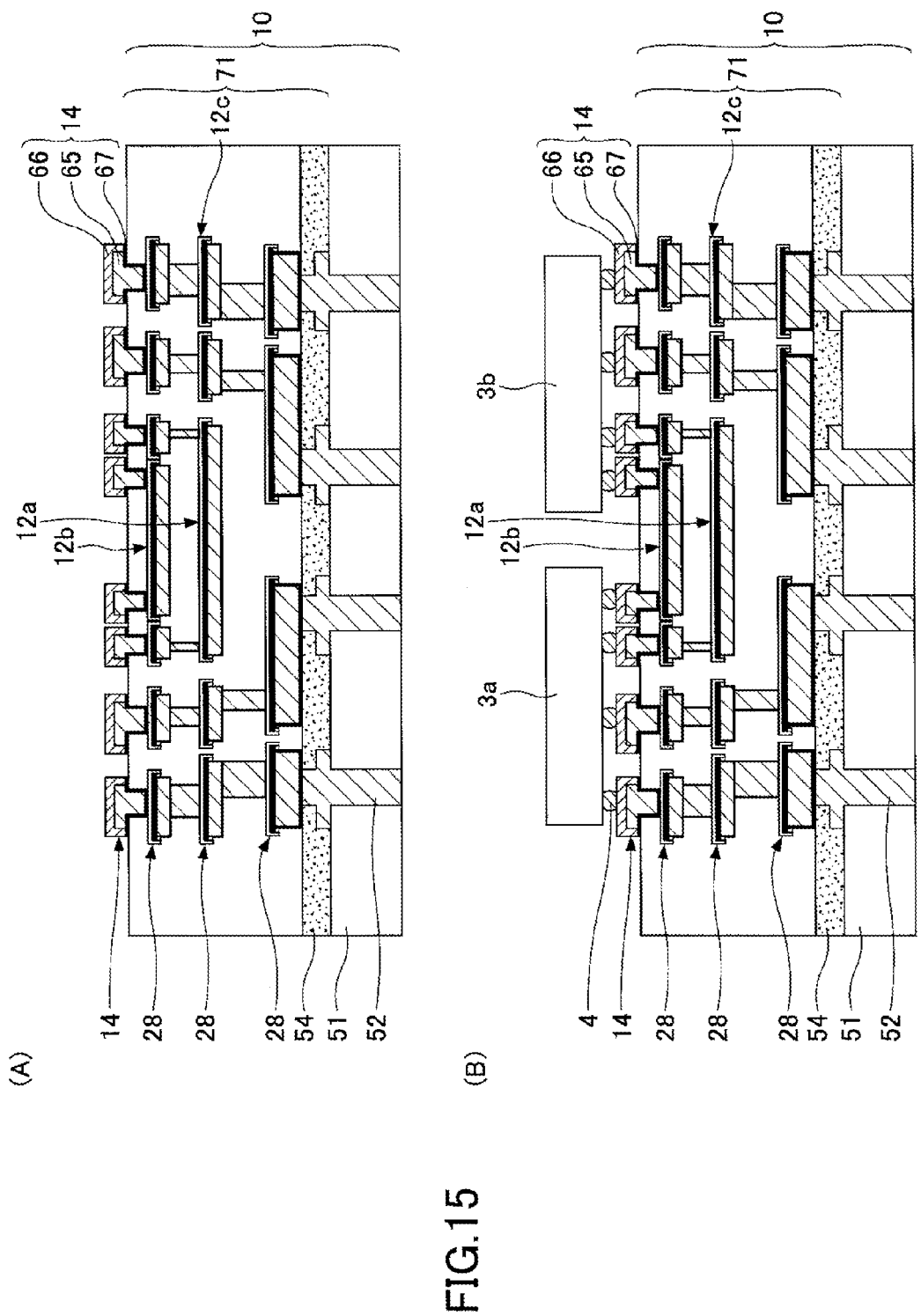
FIG. 15 illustrates a manufacturing process of the semiconductor device, following the process of FIG. 14.

In step (A) of FIG. 15, a layer stack 66 of nickel phosphorus and gold (Ni—P(200 nm)/Au(500 nm)) is formed as an under bump metal (UBM) 66 to fabricate an electrode pad 14 of the relay substrate (or the interposer) 10.

In step (B) of FIG. 15, protruding electrodes 4 of the semiconductor chips 3a and 3b are connected onto the electrode pads 14 of the interposer 10.

Figure 16:
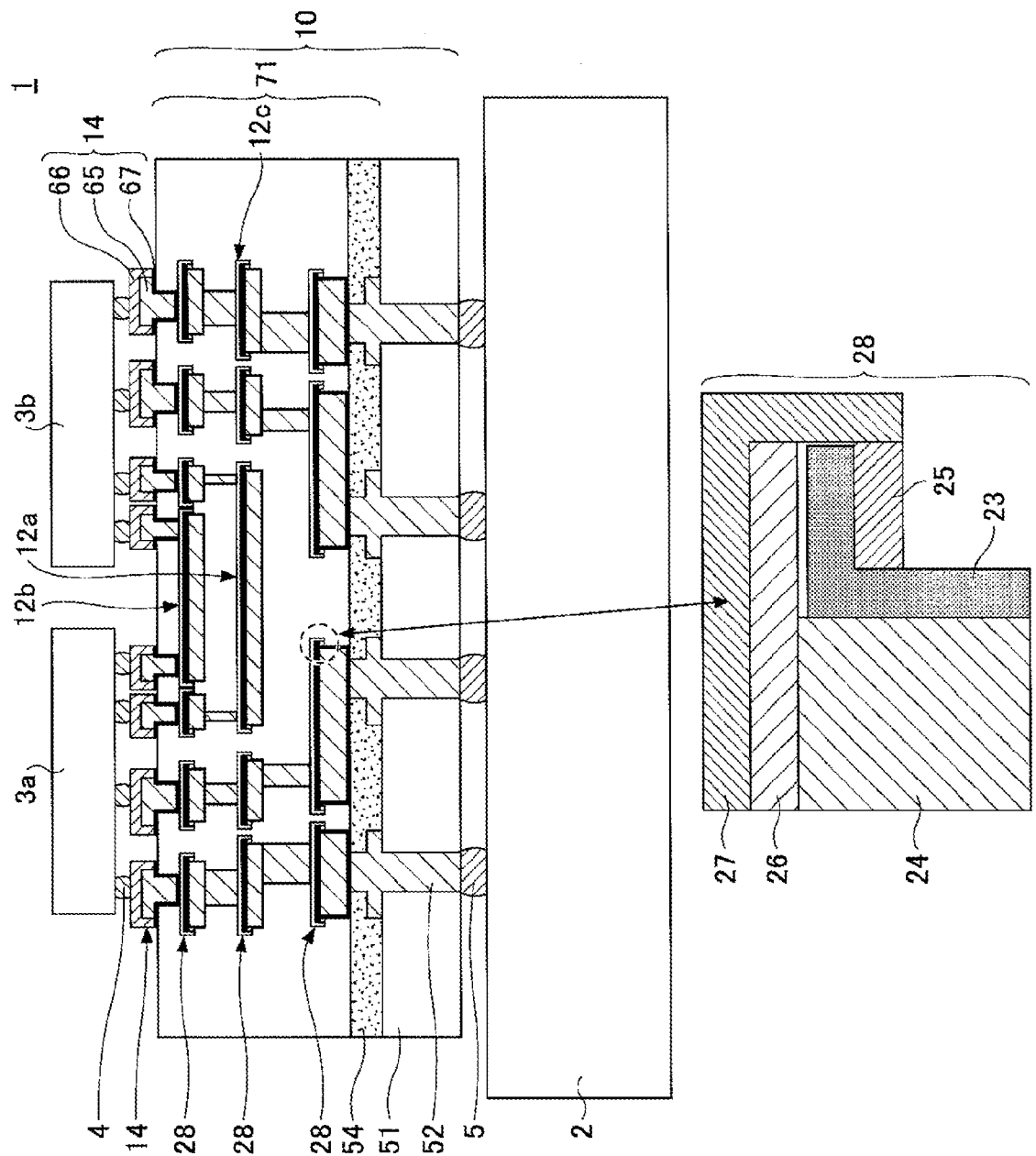
FIG. 16 illustrates a manufacturing process of the semiconductor device, following the process of FIG. 15.

In a step of FIG. 16, the interposer 10 on which multiple semiconductor chips 3a and 3b are mounted is mounted over the package substrate 2 to fabricate a semiconductor device 1. Because the interconnection formed in the interposer 10 employs the interconnect structure 28 that can effectively prevent copper diffusion, the reliability and the durability of the semiconductor device 1 are improved. The interconnect structure 28 may be applied to the global interconnects in the semiconductor chips 3a and 3b as has been described above.

In this specification and claims, when using prepositions representing positional relationship, the direction of layers stacked with respect to the substrate is upward.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
    a copper interconnect provided in a damascene trench in an insulation film;
    a metal film provided on the insulation film along a boundary between a top face of the insulation film and an uppermost part of the copper interconnect;
    a barrier metal provided between an inner wall of the damascene trench and the copper interconnect and extending over the metal film;
    a first metal cap covering a top face of the copper interconnect and a top face of the barrier metal located over the metal film, the first metal cap having overflowed from the top face of the copper interconnect to the top face of the barrier metal located over the metal film; and
    a second metal cap directly covering a top surface of the first metal cap, an end face of the barrier metal, and an end face of the metal film, the second metal cap being in contact with the top surface of the first metal cap, the end face of the barrier metal, and the end face of the metal film.

2. The semiconductor device according to claim 1, wherein the metal film is a residual of a metal mask used to form the damascene trench in the insulation film.

3. The semiconductor device according to claim 1, wherein the metal film, the barrier metal, the first metal cap and the second metal cap are layered in this order on the insulation film along the boundary between the copper interconnect and the insulation film, and the second metal cap continuously covers an end face of the first metal cap, the end face of the barrier metal, and the end face of the metal film.

4. The semiconductor device according to claim 1, wherein the metal film is formed of a material different from the barrier metal.

5. The semiconductor device according to claim 1, wherein the metal film is formed of a material that allows the second metal cap to be deposited.

6. The semiconductor device according to claim 1, wherein a material of the metal film is selected from Co, Ni, Cr, Fe, Pt, or Au.

7. The semiconductor device according to claim 1, wherein a material of the second metal cap is selected from Co, Ni, W—P, Ni—P, Ni—W—P, Co—W—P, or Au.

8. The semiconductor device according to claim 1, wherein the copper interconnect is a rewiring interconnect formed on a substrate on which a semiconductor chip is mounted.

9. The semiconductor device according to claim 1, wherein the copper interconnect is a global interconnect formed in a semiconductor chip.

* * * * *